(12) United States Patent
Arakawa

(10) Patent No.: US 9,396,803 B2
(45) Date of Patent: Jul. 19, 2016

(54) NON-VOLATILE SEMICONDUCTOR MEMORY DEVICE

(71) Applicant: Winbond Electronics Corp., Taichung (TW)

(72) Inventor: Kenichi Arakawa, Chiba (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/740,278

(22) Filed: Jun. 16, 2015

(65) Prior Publication Data

US 2016/0141039 A1 May 19, 2016

(30) Foreign Application Priority Data

Nov. 19, 2014 (JP) .................................. 2014-234109

(51) Int. Cl.
*G11C 16/10* (2006.01)
*G11C 16/14* (2006.01)
*G11C 16/04* (2006.01)

(52) U.S. Cl.
CPC ............ *G11C 16/14* (2013.01); *G11C 16/0483* (2013.01)

(58) Field of Classification Search
CPC ............................. G11C 16/0483; G11C 16/10
USPC ........................................ 365/185.17, 185.24
See application file for complete search history.

(56) References Cited

U.S. PATENT DOCUMENTS

| 6,724,682 | B2* | 4/2004 | Lee et al. | ............... G11C 16/08 365/230.06 |
| 7,969,784 | B2* | 6/2011 | Takeuchi et al. | ...... G11C 7/1051 365/185.03 |
| 8,081,513 | B2* | 12/2011 | Fukuda | .............. G11C 16/3404 365/185.17 |
| 8,705,273 | B2* | 4/2014 | Kim et al. | ................ G11C 5/14 365/185.03 |

FOREIGN PATENT DOCUMENTS

JP            5550609            7/2014

OTHER PUBLICATIONS

Fukuda et al, "A 151mm2 64Gb MLC NAND Flash Memory in 24nm CMOS Technology," 2011 IEEE International Solid-State Circuits Conference, Feb. 20-24, 2011, pp. 198-199.

* cited by examiner

*Primary Examiner* — Michael Tran
(74) *Attorney, Agent, or Firm* — Jianq Chyun IP Office

(57) ABSTRACT

A semiconductor memory device, which restrains a breakdown of a low-voltage transistor constructing a bit line selecting circuit, is provided. An NAND string unit and transistors (BLSe, BLso, BIASe, BIASo) that construct bit line selecting circuit are formed in a P-well. The transistors are set in a floating state during erasing operation. The voltages of the transistors are increased when an erasing voltage is applied to the P-well. When the erasing voltage is discharged from the P-well, the gates of the transistors are connected to a reference potential via a discharging circuit (410) such that the gate voltage follows the voltage of the P-well to be discharged.

8 Claims, 7 Drawing Sheets

NON-VOLATILE SEMICONDUCTOR MEMORY DEVICE

CROSS-REFERENCE TO RELATED APPLICATION

This application claims the priority benefit of Japanese application serial no. 2014-234109, filed on Nov. 19, 2014. The entirety of the above-mentioned patent application is hereby incorporated by reference herein and made a part of this specification.

BACKGROUND OF THE DISCLOSURE

1. Field of the Disclosure

The disclosure is related to a non-volatile semiconductor memory device, and more particularly to an NAND (Not And) flash memory.

2. Description of Related Art

An NAND flash memory is formed to have a memory block array. The memory block array is formed with a plurality of NAND strings arranged in a column direction. The NAND string is formed to have a plurality of memory cells connected in series and a selecting transistor connected to both ends thereof, wherein an end portion is connected to a bit line via a bit line side selecting transistor and the other end portion is connected to a source line via a source line side selecting transistor. The operation of reading out or programming (writing in) data is performed through the bit line that is connected to the NAND string.

FIG. 1 is a structural view illustrating a bit line selecting circuit of a conventional NAND flash memory. Here, the drawing shows a pair of bit lines, namely an even bit line BLe and an odd bit line BLo. A bit line selecting circuit 10 includes a first selecting portion 20 including a bit line selecting transistor BLC. The bit line selecting transistor BLC connects the even bit line BLe or the odd bit line BLo to a read-out circuit. A second selecting portion 30 includes an even bias voltage transistor BIASe and an odd bias voltage transistor BIASo, an even bit line selecting transistor BLSe and an odd bit line selecting transistor BLSo. The even bias voltage transistor BIASe and the odd bias voltage transistor BIASo apply a bias voltage VPRE to the even bit line BLe and the odd bit line BLo. The even bit line selecting transistor BLSe connects the even bit line BLe to the bit line selecting transistor BLS. The odd bit line selecting transistor BLSo connects the odd bit line BLo to the bit line selecting transistor BLC. The bit line selecting circuit 10 is connected to the read-out circuit 40. Here, the second selecting portion 30 is formed on a P substrate that is different from a P well region that forms a grid array. When an erase operation is performed, an erase voltage is applied to a selected block (P well) so that all the bit lines are boosted to the erase voltage. On the other hand, since the P substrate is 0 V (GND), the even bias voltage transistor BIASe and the odd bias voltage transistor BIASo, the even bit line selecting transistor BLSe and the odd bit line selecting transistor BLSo that form that the second selecting portion 30 include a high voltage (HV) transistor that has a thick gate oxide film, long gate length and bears the high voltage.

In Japanese Patent No. 5550609, Japanese Patent Publication No. JP 2011-23661 and non-patent literature (K. Fukuda. Et al., "A 151 mm2 64 Gb MLC NAND Memory in 24n, CMOS Technology", IEEE International Solid-State Circuit Conference, Digest of Technical Paper P198-199, Session 11, 2011), as shown by FIG. 2, the second selecting portion 30A of a bit line selecting circuit 10A includes a low voltage (LV) transistor. A relay portion 32 that includes a high voltage transistor BLS is configured between the second selecting portion 30A and the first selecting portion 20. The transistors BIASe, BIASo, BLSe, BLSo that form the second selecting portion 30A are formed in a block 50, i.e. P well 6, that forms the memory array of the NAND string unit NU. The transistors BIASe, BIASo, BLSe and BLSo are low voltage transistors that have short gate length and thin gate oxide film and formed in the same manufacturing process in which the memory cell is manufactured. The transistor BLS of the relay portion 32 is configured at an external side of the P well 60 that forms the memory cell array so that the transistor BLC of the first selection portion 20 is separated from the transistor of the second selecting portion 30A. The second selecting portion 30A is set as a structure of a low voltage transistor so as to reduce the arrangement area used for the second selecting portion 30A, whereby implementing minimizing the size of the overall memory. Moreover, when the erase operation is performed, about 20 V of an erase voltage or an erase pulse is applied to the P well 60. At this time, the gate of all transistors that form the second selecting portion 30A is set to be in a floating state. The gate of the transistor is coupled to the capacitor of the P well 60 and thus is boosted to be close to the erase voltage. Therefore, a big potential difference is not applied to the gate oxide film of the transistors BIASe, BIASo, BLSe, BLSo, thereby avoiding breakdown of the gate oxide film.

SUMMARY OF THE DISCLOSURE

As indicated above, by forming the transistors BIASe, BIASo, BLSe and BLSo of the second selecting portion 30A in the block 50, i.e. P well 60, of the memory array, the area used for the second selecting portion 30A may be reduced. However, the structure of such second selecting portion 30A causes problems as follows.

When the erase operation is performed, the transistors BIASe, BIASo, BLSe and BLSo of the second selecting portion 30A are set to be in a floating status. When an erase voltage Vers applied to the P well 60 rises, a gate voltage Vgate of the transistors BIASe, BIASo, BLSe and BLSo gradually boosts because of being coupled to the capacitor of a P well voltage Vpw. A peak value of the applied erase voltage Vers is, for example, about 20 V. The erase voltage Vers keeps the peak value voltage during a fixed period so as to sufficiently release electrons to the P well 60 from the memory cell. When the application of the erase voltage Vers is over, the P well voltage Vpw is discharged, and correspondingly, the gate voltage Vgate of the transistors also gradually decreases.

However, the gate of the transistors BIASe, BIASo, BLSe and BLSo is connected to a wiring that extends across the P well 60. Therefore, the gate voltage Vgate is sometimes affected by a P-type silicon substrate right below the wiring or a parasitic capacitor of other wells and a parasitic capacitor of adjacent wirings, and may not decrease along with the descended P well voltage Vpw.

FIG. 3 is a schematic diagram illustrating the P well voltage Vpw and the gate voltage Vgate of the transistors BIASe, BIASo, BLSe and BLSo. In the diagram, the solid line represents the P well voltage Vpw, and the dotted line represents the gate voltage Vgate. At timing t0, 0 V is applied to a word line WL of the selected block, and the transistors BIASe, BIASo, BLSe and BLSo are set to be in a floating status. At timing T1, the erase voltage Vers is applied to the P well 60. For example, an erase pulse with a voltage that becomes higher stage by stage is applied to the P well. Corresponding to the application of the erase pulse, the P well voltage Vpw begins to boost. In the meantime, the gate voltage Vgate of the transistors BIASe, BIASo, BLSe and BLSo coupled to the P well capacitor boosts. At timing T2, the P well voltage Vpw boosts to about 20 V. Within a period of timing T2 to T3, after the fixed time required for the erase operation passes, an electron is withdrawn out of the P well 60 from the floating gate.

Within the period T2 to T3 during which the erase operation is performed, the gate voltage Vgate of the transistors BIASe, BIASo, BLSe and BLSo is set to be below a fixed potential according to a coupling ratio between the gate voltage Vgate and the P well 60. As shown by FIG. 3, if a potential difference Va between the P well voltage Vpw and the gate voltage Vgate of the transistors is not set to be below a fixed value, the transistors are damaged due to the characteristic of time dependent dielectric breakdown (TDDB). TDDB is a phenomenon as described below. Even if a high voltage is not applied to the gate of the transistor, under the circumstances where a voltage is applied for a long period of time, the transistor may still be broken down. Therefore, the coupling ratio between the transistor and the P well is set in the manner of Va<TDDB.

At timing T3, when the application of the erase voltage Vers is over, the P well voltage Vpw is discharged. When the discharging operation begins, a discharging path is connected to the P well 60 and the charge is released via the discharging path. Accordingly, the P well voltage Vpw decreases relatively faster. On the other hand, the gate of the transistors BIASe, BIASo, BLSe and BLSo is not connected to the discharging path that releases the charge thereof. Furthermore, the gate is connected to a wiring that has a parasitic capacitor. Thus, the discharging speed of the gate voltage Vgate is slower than the P well voltage Vpw. As a result, at timing T4, when the P well voltage Vpw reaches 0 V, the gate voltage Vgate of the transistors is still voltage Vb. If Vb>TDDB, it is likely that the transistors BIASe, BIASo, BLSe and BLSo may be broken down.

Therefore, in order to solve the above-mentioned problem, a semiconductor memory device which inhibits breakdown of a low voltage transistor that forms a bit line selecting circuit is provided.

In the disclosure, the semiconductor memory device includes a memory cell array formed to have a plurality of NAND strings, wherein the NAND strings are formed by electrically rewritable memory cells connected in series; an erasing member that erases the memory cell in a selected block of the memory cell array; and a bit line selecting circuit that selects the bit line which is connected to the NAND strings respectively, at least one bit line selecting transistor that forms the bit line selecting circuit is formed in the well and the well forms the memory cell. The erasing member includes a first member that applies the erase voltage to the well of the selected block; a second member that sets the at least one bit line selecting transistor formed in the well of the selected block to be in a floating status; and a third member that makes the gate of the at least one bit line selecting transistor to be discharged to a reference potential when the voltage of the well of the selected block is discharged.

In one embodiment of the disclosure, the third member generates a discharging path between the gate of the at least one bit line selecting transistor and the reference potential.

In one embodiment of the disclosure, the third member includes a first discharging transistor. The first discharging transistor is configured for generating a discharging path between the gate of the at least one bit line selecting transistor and the reference potential. Meanwhile, the first discharging transistor is conducted when the voltage of the well is discharged.

In one embodiment of the disclosure, the third member includes at least one diode. The at least one diode is connected to the first discharging transistor in series between the gate of the at least one bit line selecting transistor and the reference potential.

In one embodiment of the disclosure, the at least one diode makes a fixed potential difference to be generated between the gate of the at least one bit line selecting transistor and the well within the discharging period. In the meantime, the fixed potential difference is less than TDDB of the at least one bit line selecting transistor.

In one embodiment of the disclosure, the third member includes a second discharging transistor and a third discharging transistor. The second discharging transistor is used for generating a discharging path between the well and the reference potential. The third discharging transistor generates a discharging path between a source line and the reference potential, wherein the source line is co-connected to the NAND string of the well. and the third discharging transistor supplies a common discharge enabling signal to each gate of the first discharging transistor, the second discharging transistor and the third discharging transistor.

In one embodiment of the disclosure, when the voltage of the well and the voltage of the source line are discharged to the reference potential via the second discharging transistor and the third discharging transistor, the at least one diode has a threshold that is larger than the threshold of the at least one bit line selecting transistor.

In one embodiment of the disclosure, the at least one bit line selecting transistor includes an even bit line selecting transistor that selects an even bit line as well as an odd bit line selecting transistor that selects an odd bit line. The even bit line selecting transistor and the odd bit line selecting transistor are conducted in the manner that the voltage of a common node thereof is discharged to the reference potential.

In one embodiment of the disclosure, the at least one diode includes a transistor that can bear higher voltage than the at least one bit line selecting transistor.

In one embodiment of the disclosure, the bit line selecting circuit includes an even bias voltage transistor that applies bias voltage to the even bit line as well as an odd bias voltage transistor that applies bias voltage to the odd bit line. The third member causes each gate of the even bias voltage transistor and the odd bias voltage transistor to discharge.

In order to make the aforementioned features and advantages of the disclosure more comprehensible, embodiments accompanying figures are described in detail below.

DESCRIPTION OF EMBODIMENTS

Figure 1:
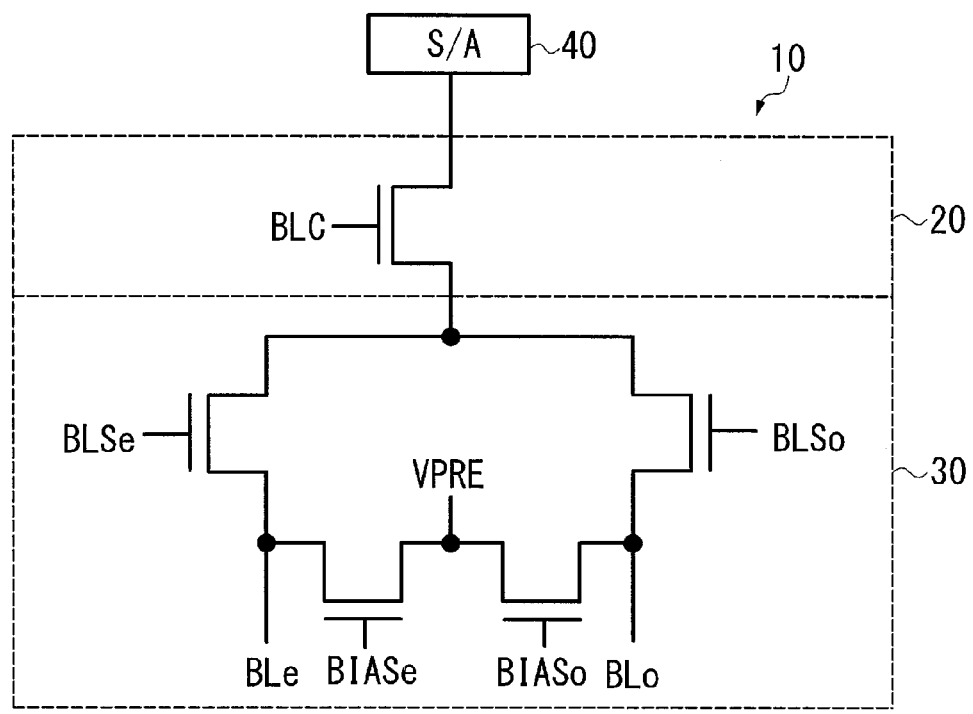
FIG. 1 is a structural view illustrating a bit line selecting circuit of a conventional NAND flash memory.

The following embodiments are described in details with accompany drawings. In addition, please note that, in the accompany drawings, special emphasis is laid on different part for ease of understanding. The proportion of the element in the drawings is different from the actual proportion of elements.

Figure 4:
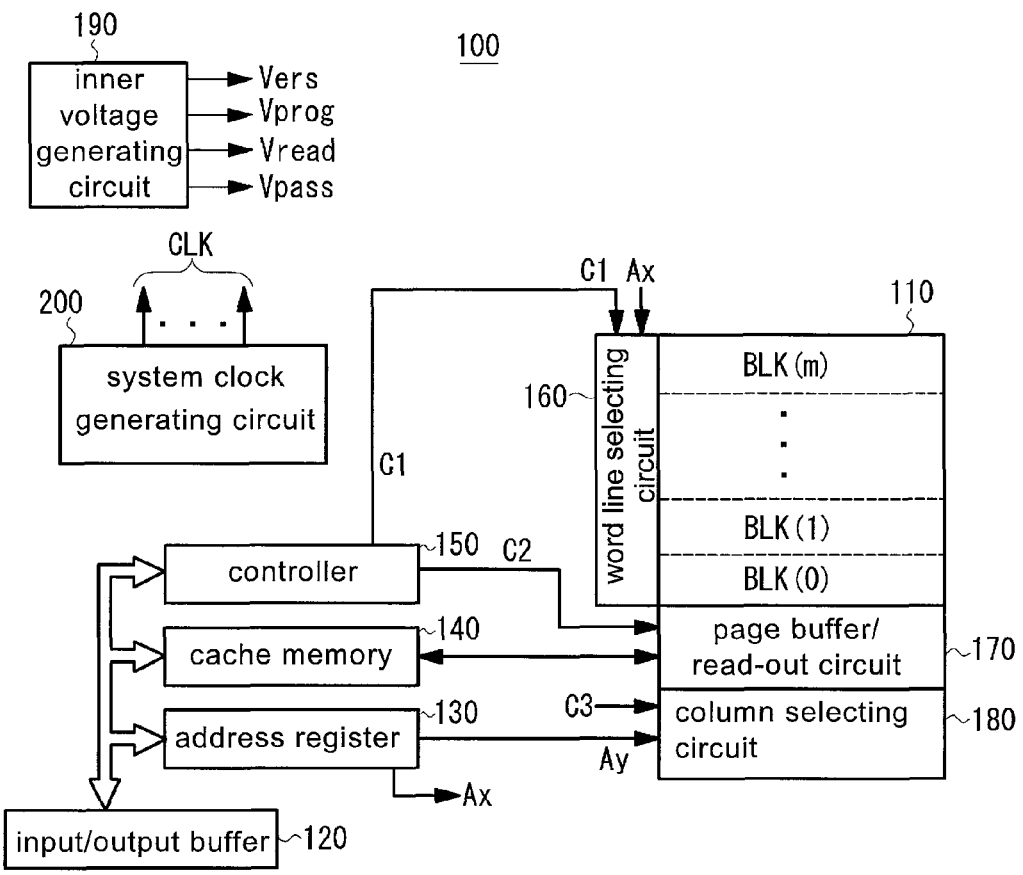
FIG. 4 is a block diagram illustrating an example of an overall structure of an NAND flash memory according to an embodiment of the disclosure.

FIG. 4 is a block diagram illustrating an example of a structure of an NAND flash memory according to an embodiment of the disclosure. As shown by FIG. 4, the flash memory 100 includes a memory array 110 formed to have a plurality of memory cells arranged in matrix; an input/output buffer 120 connected to an external input/output terminal I/O; an address register 130 receiving address information from the input/output buffer 120; a cache memory 140 retaining the input/output information; a controller 150 generating controlling signals C1, C2 and C3 etc., wherein the controlling signals C1, C2 and C3 control each portion based on instruction data from the input/output buffer 120 and an external controlling signal (e.g. chip enable or address latch enable that are not shown); a word line selecting circuit 160 encoding row address information Ax from the address register 130 and perform block selection and word line selection based on the decoding result; a page buffer/read-out circuit 170 retaining the information read out via the bit line or retaining the programming data via the bit line; a column selecting circuit 180 decoding column address information Ay from the address register 130 and performs bit line selection according to the decoding result; an inner voltage generating circuit 190 generating voltage (programming voltage Vprog, passing voltage Vpass, read-out voltage Vread, erasing voltage Vers (including erasing pulse etc.)) required for reading out, programming and erasing data; and a system clock generating circuit 200 generating an inner system clock CLK.

The memory array 110 has a plurality of blocks BLK (0), BLK (1), ..., BLK(m) arranged along a column direction. The page buffer/read-out circuit 170 is disposed in one of the end portions of the block. However, the page buffer/read-out circuit 170 may also be disposed in another end portion of the block or the end portions at both sides.

Figure 5:
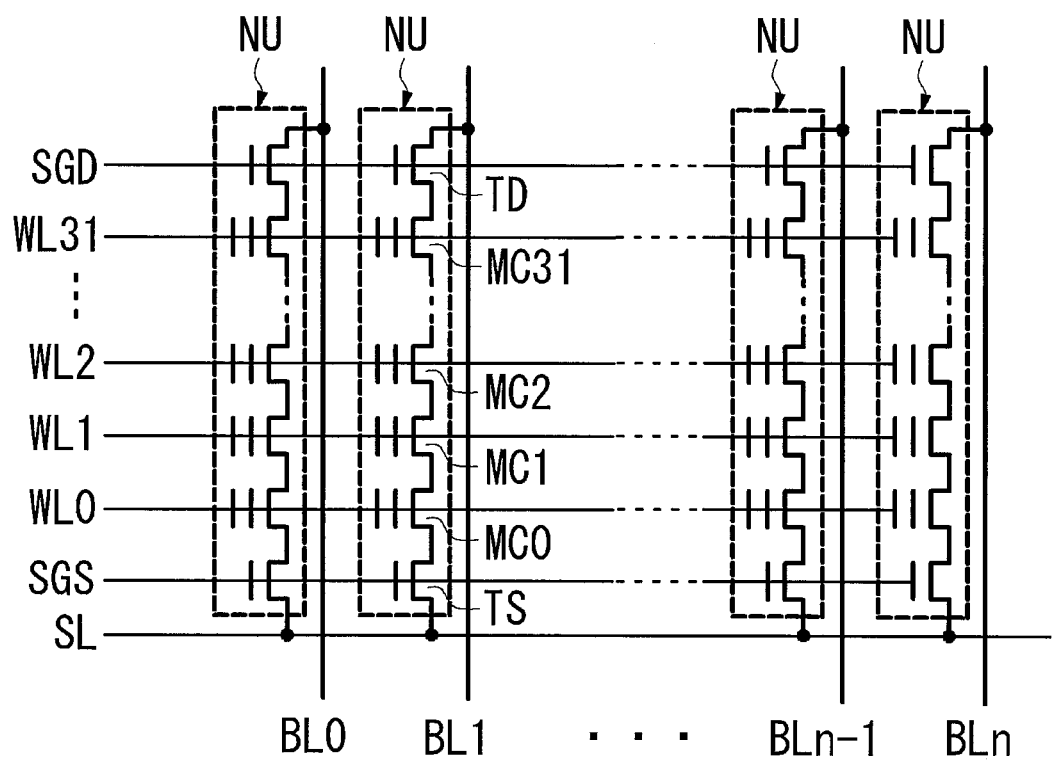
FIG. 5 is an equivalent circuit diagram of an NAND string.

As shown by FIG. 5, a block is formed to have a plurality of NAND string units NU connecting a plurality of memory cells in series. In a block, n+1$^{th}$ string units NU are arranged in a row direction. The string units NU include a plurality of memory cells MCi (i=0, 1, ..., 31) connected in series; a bit line side selecting transistor TD connected to one of the end portion, i.e. memory cell MC31; a source line side selecting transistor TS connected to another end portion, i.e. memory cell MC0, a drain of the bit line side selecting transistor TD is connected to one corresponding bit line BL; a source of the source line side selecting transistor TS is connected to a common source line SL. A control gate of the memory cell MCi is connected to a word line WLi. A gate of the bit line side selecting transistor TD is connected to a selecting gate line SGD. The source line side selecting transistor TS is connected to a selecting gate line SGS. When the word line selecting circuit 160 selects blocks according to the row address Ax, the transistors TD and TS are selectively driven via the selecting gate lines SGS and SGD of the block.

A typical memory cell is a metal oxide semiconductor (MOS) structure. The MOS structure includes a source/drain as an N type diffusion region formed in a P well; a tunnel oxide film formed on a channel between the source/drain; a floating gate (charge storage layer) formed on the tunnel oxide film; and a control gate formed on the floating gate via a dielectric film. When the charge is not stored in the floating gate, that is, when data "1" is written in, the threshold is in a negative state, and the control gate of the memory cell is 0 V and conducted. When electron is stored in the floating gate, that is, when data "0" is written in, the threshold turns into the positive state, and the control gate of the memory cell is 0 V and disconnected. However, the memory cell is not limited to memorizing a single bit only; the memory cell may also memorize a plurality of bits.

Figure 2:
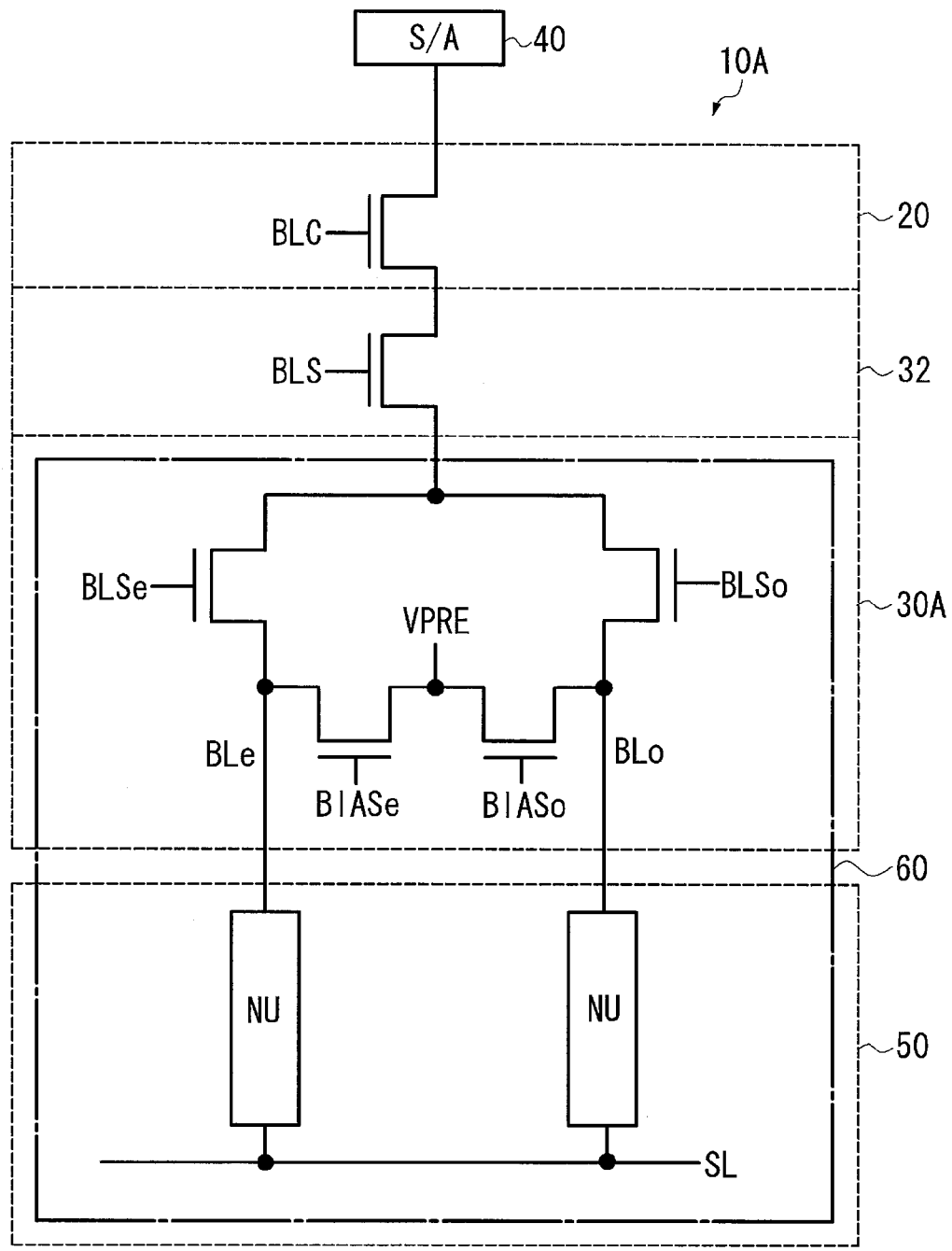
FIG. 2 is a structural view illustrating a bit line selecting circuit of a conventional NAND flash memory.
Figure 3:
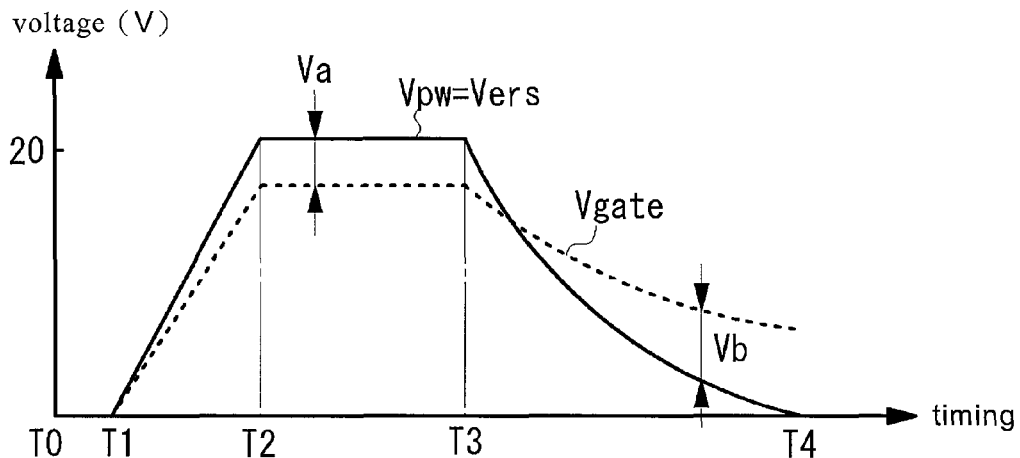
FIG. 3 is a diagram illustrating a P well voltage of a conventional NAND flash memory and a gate voltage of a transistor of a bit line selecting circuit.

The column selecting circuit 180 includes a bit line selecting circuit 30A as shown by FIG. 2. The bit line selecting circuit 30A is formed in a P well of the memory cell in the manner described below. Preferably, the bit line selecting circuit 30A is formed in the P well of each block respectively. The bit line selecting circuit 30A is controlled by the controller 150 when performing reading-out, programming and erasing actions. For example, under the circumstances where an action of reading-out a selected page is performed, when the even bit line BLe is selected and the odd bit line BLo is non-selected, the even bit line selecting transistor BLSe and the bit line selecting transistor BLS are conducted; the odd bit line selecting transistor BLSo is disconnected; the even bias voltage transistor BIASe is disconnected; and the odd bias voltage transistor BIASo is conducted and supplied to a shielding potential via an imaginary power VPRE. In the meantime, when the odd bit line BLo is selected and the even bit line BLe is non-selected, the odd bit line selecting transistor BLSo and the bit line selecting transistor BLS are conducted. The even bit line selecting transistor BLSe is disconnected; the odd bias voltage transistor BIASo is disconnected, and the even bias voltage transistor BIASe is conducted and supplied to the shielding potential via the imaginary power VPRE. When programming action is performed, the odd bias voltage transistor BIASo and the even bias voltage transistor BIASe may supply a program-disable voltage from the imaginary power VPRE to a write-disable bit line.

The table below is an example showing the applied bias voltage when the flash memory performs actions:

|  | Erase | Write-in | Read-out |
| --- | --- | --- | --- |
| Selected W/L | 0 | 15~20 V | 0 |
| Non-selected W/L | F | 10 V | 4.5 |
| SGD | F | Vcc | 4.5 |
| SGS | F | 0 | 4.5 |
| SL | F | Vcc | 0 |
| P well | 21 | 0 | 0 |

When the read-out action is performed, a certain positive voltage is applied to the bit line, a certain voltage (e.g. 0 V) is applied to the selected word line, a voltage Vpass (e.g. 4.5V) is applied to the non-selected word line, a positive voltage (e.g. 4.5V) is applied to the select gate lines SGD and SGS, such that the bit line side selecting transistor TD and the source line selecting transistor TS are conducted and apply 0 V to the common source line. When the programming (writing-in) action is performed, a high programming voltage Vprog (15V-20V) is applied to the selected word line, an intermediate potential (e.g. 10V) is applied to the non-selected word line such that the bit line side selecting transistor TD is conducted and the source line side selecting transistor TS is disconnected. Moreover, a potential corresponding to data "0" or "1" is supplied to the bit line BL. When the erase action is performed, voltage 0 V is applied to the selected word line in the block. A high voltage (e.g. 20V) is applied to the P well as the erase voltage Vers. The electron of the floating gate is withdrawn to the substrate to erase data in unit of block.

Figure 6:
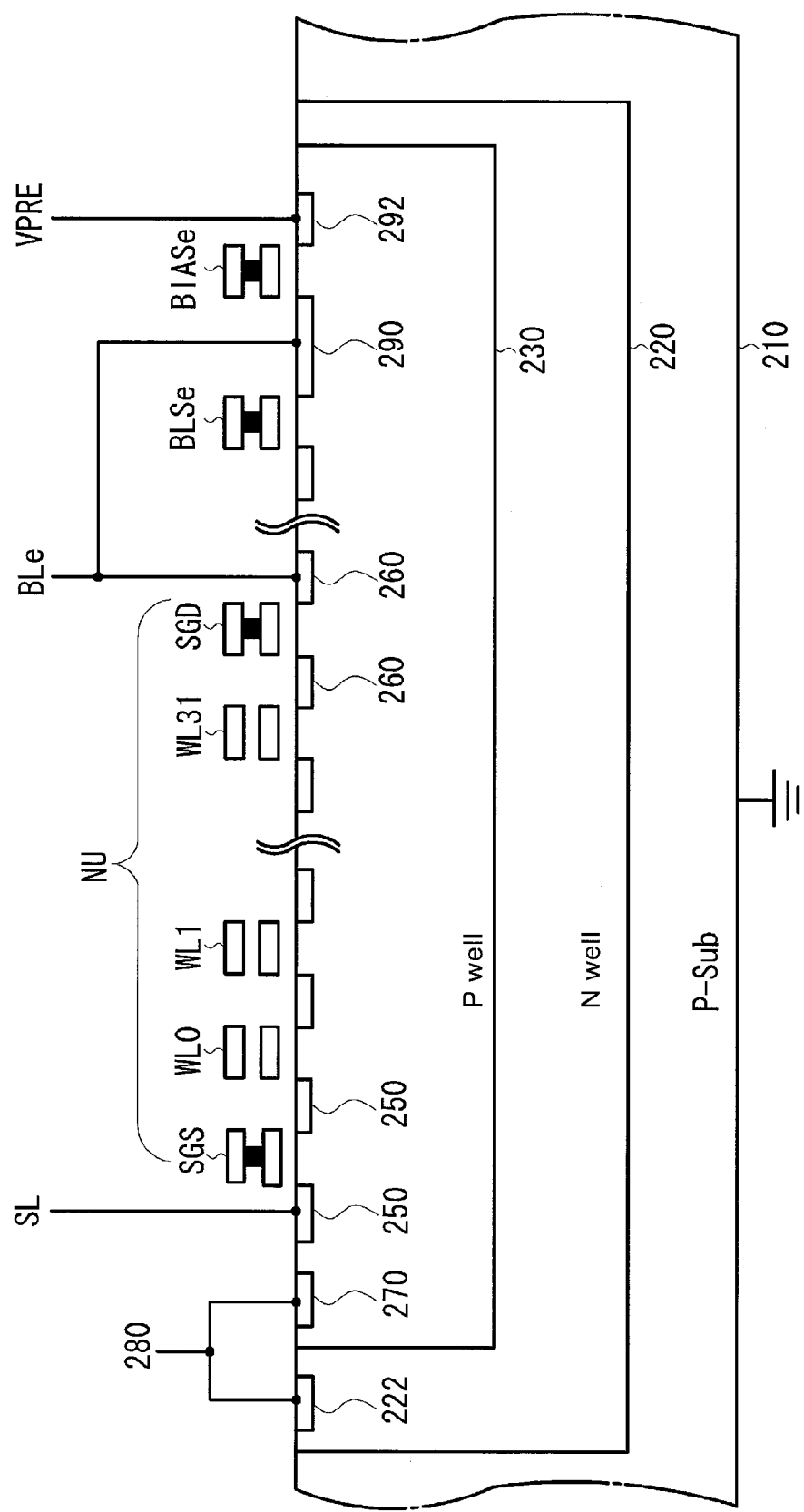
FIG. 6 is a schematic cross-sectional view illustrating a structure of a memory cell array.

FIG. 6 is a schematic sectional view illustrating a memory cell array. It should be noted that the exemplary embodiment only shows the NAND string unit NU connected to the even bit line BLe, an even bit line selecting transistor BLSe constituting the bit line selecting circuit 30A and the even bias voltage transistor BIASe. An N well 220 is formed in a P-type silicon substrate 210. A P well 230 is formed in the N well 220. One P well 230 corresponds to one block. A transistor that constitutes the NAND string unit NU is formed in the P well 230. Furthermore, in the P well 230, the even bit line selecting transistor BLSe that constitutes the second selecting portion 30A as shown by FIG. 2 and the even bias voltage transistor BIASe are formed therein.

The source line SL is connected to an n-type diffusion region 250 of the source line side selecting transistor TS. The even bit line BLe is connected an n-type diffusion region 260 of the bit line side selecting transistor TD. A p+diffusion region 270 of the P well 230 and an n+diffusion region 222 of the N well 220 are connected a contacting portion 280 shared by the N well/P well. The common contacting portion 280 is connected to an inner voltage generating circuit 190, for example, being applied with the erase voltage Vers when the erase action is performed, or discharging the voltage of the P well via the contacting portion 280. In the meantime, the even bit line BLe is connected to the diffusion region 290. The diffusion region 290 forms a common node for the even bit line selecting transistor BLSe and the even bias voltage transistor BIASe formed in the P well 230. The imaginary power VPRE is connected to another diffusion region 292 of the even bias voltage transistor BIASe. The even bit line selecting transistor BLSe and the even bias voltage transistor BIASe are N-type MOS transistors with low voltage formed by using the same manufacturing process for manufacturing the memory cell.

Figure 7:
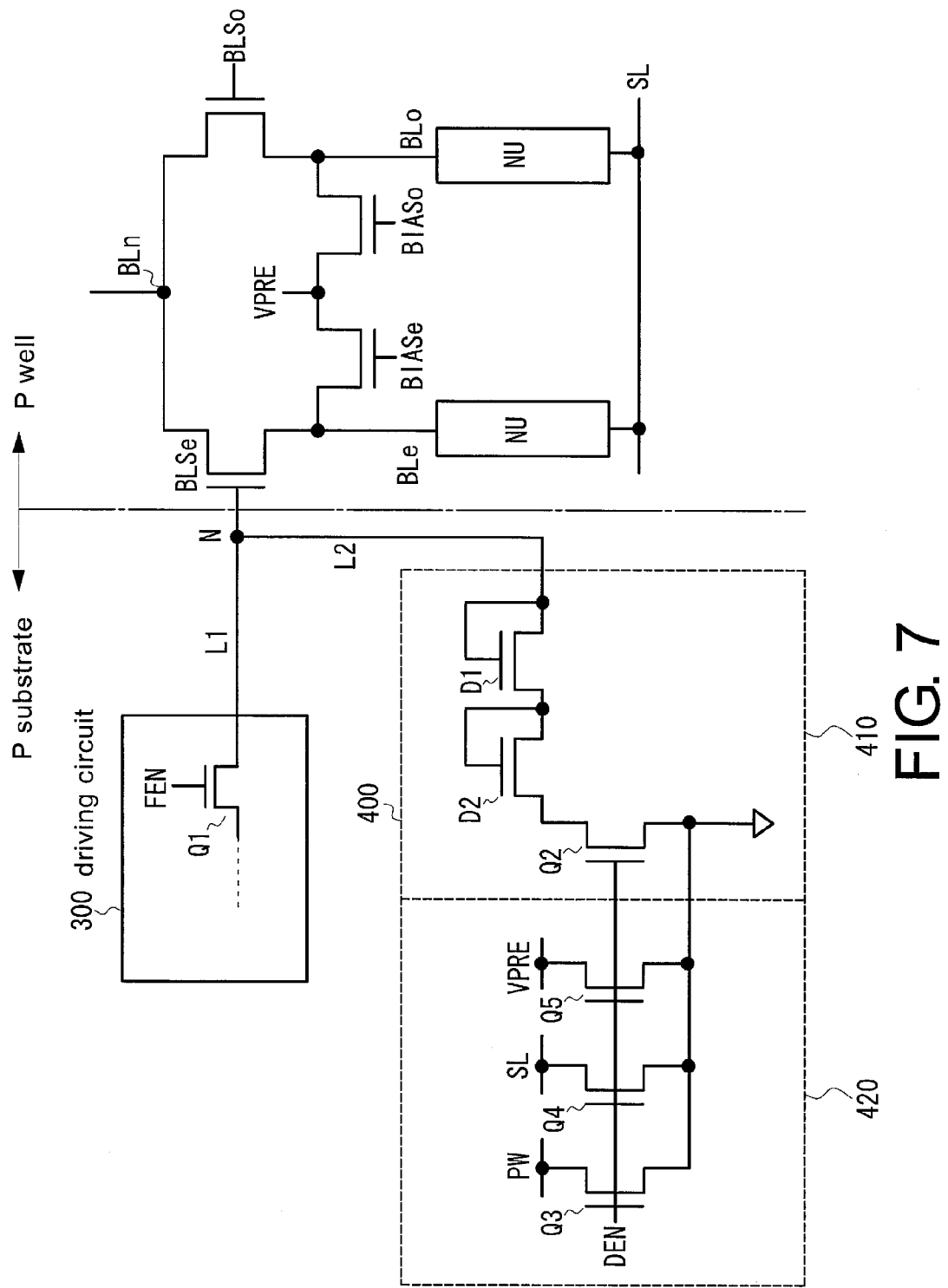
FIG. 7 is a structural view illustrating a floating state and a discharging state of an even bit line selecting transistor that forms a bit line selecting circuit.

FIG. 7 is a diagram illustrating a discharging circuit and a driving circuit connected to the bit line selecting circuit. It should be noted that the exemplary embodiment only shows a discharging circuit and a driving circuit connected to the even bit line selecting transistor BLSe that constitutes the bit line selecting circuit 30A. In FIG. 7, PW refers to the P well. Other odd bit line selecting transistors BLSo, even bias voltage transistor BIASe and the odd bias voltage transistor BIASo that constitute the bit line selecting circuit 30A are connected to the same discharging circuit and the driving circuit connected to the even bit line selecting transistor BLSe.

A column selecting circuit 180 includes a driving circuit 300 and a discharging circuit 400. The driving circuit 300 and the discharging circuit 400 are formed in the P-type silicon substrate or formed in a well different from the P well 230. A driving circuit 300 is connected to a node N connected to the gate of the even bit line selecting transistor BLSe via a wiring L1. The driving circuit 300 includes an N-type driving transistor Q1 connected to the node N. The gate of the driving transistor Q1 is connected to a floating enabling signal FEN. During the period when the erase action is performed, the floating enabling signal FEN is migrated to an L level, and the driving transistor Q1 is disconnected. Accordingly, the even bit line selecting transistor BLSe is set to be in the floating state. In addition, the driving circuit 300 drives the driving transistor Q1 appropriately when the read-out or programming action is performed; here, the related descriptions are not incorporated.

Moreover, the gate of the even bit line selecting transistor BLSe is connected to the discharging circuit 400 via a wiring L2. The discharging circuit 400 includes a first discharging circuit 410 that discharges the gate of the even bit line selecting transistor BLSe, and a second discharging circuit 420 that discharges the P well 230, the source line SL and the node of the imaginary power VPRE when the erase action is performed.

The first discharging circuit 410 includes two diodes D1 and D2 connected to the gate of the even bit line selecting transistor BLSe in series and a discharging transistor Q2. The discharging transistor Q2 is connected between the diode D2 and a reference potential, and the gate thereof is connected to a discharging enabling signal DEN. When the discharging enabling signal DEN is set to be at an H level, the discharging transistor Q2 is conducted. The gate of the even bit line selecting transistor BLSe is electrically connected to the reference potential via the wiring L2, and a discharging path is generated between the node N and the reference potential.

The diodes D1 and D2 have a threshold Vth respectively. By connecting the two diodes D1 and D2 in series, a bias voltage that offsets 2Vth from the reference potential is applied to the gate of the even bit line selecting transistor BLSe. When the P well voltage Vpw is discharged, the diodes D1 and D2 cause the voltage of the node N to change along with the P well voltage Vpw, such that the voltage of the node N reduces 2Vth substantially from the P well voltage Vpw. When the P well voltage Vpw is discharged to 0 V substantially, the even bit line selecting transistor BLSe is conducted. In the embodiment, the two diodes D1 and D2 are connected in series; however, this embodiment is only an example, the disclosure provides no limitation to the quantity of the diodes. In terms of the quantity of the diodes, it works as long as the difference between the node N and the P well voltage Vpw is below the breakdown voltage of TDDB and larger than the threshold of the even bit line selecting transistor BLSe. In addition, the diodes D1 and D2 and the discharging transistor Q2 include a transistor having a voltage that is higher than that of the even bit line selecting transistor BLSe.

The second discharging circuit 420 includes a discharging transistor Q3 connected to the P well 230, a discharging transistor Q4 connected to the source line SL and a discharging transistor Q5 connected to the imaginary power VPRE. Each gate of the discharging transistors Q3, Q4 and Q5 is co-connected to a discharging enabling signal DEN. When the discharging enabling signal DEN is at H level, the discharging transistors Q3, Q4 and Q5 are conducted; the P well 230, the source line SL, and the imaginary potential VPRE are electrically connected to the reference potential to perform discharging. The discharging transistors Q3, Q4 and Q5 include a transistor having a voltage that is higher than that of the even bit line selecting transistor BLSe.

Figure 8:
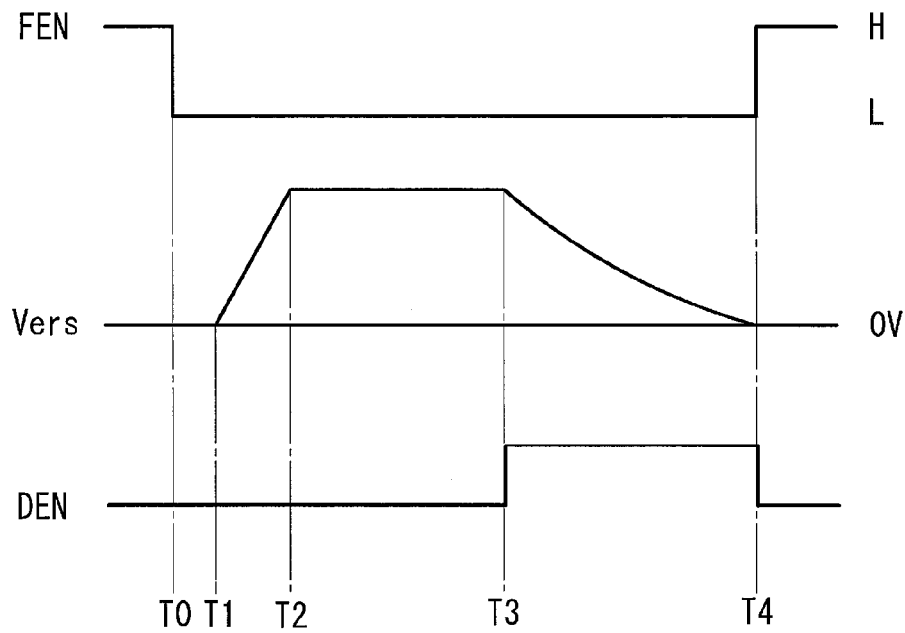
FIG. 8 is a time chart describing a relation between an erase voltage and discharging time when an erase operation is performed.

Next, please refer to the time chart of FIG. 8 for descriptions concerning an erase action described in the embodiment. When an erase instruction and a row address and so on are sent to the flash memory 100 from the external host device, the controller 150 selects a block that should be erased to execute an erase sequence. At timing T0, the driving circuit 300 migrates the floating enabling signal FEN to an L level such that the driving transistor Q1 is disconnected. Accordingly, the transistors BIASe, BIASo, BLSe, and BLSo within the P well 230 of the selected block are in a floating state. In addition, the bit line side selecting transistor TD of the selected block and source line side selecting transistor TS are set to be in a floating state and apply 0 V to the word line. Thereafter, at timing T1, the erase voltage Vers generated by the inner voltage generating circuit 190 is applied to the P well 230 and the N well 220 via the contacting portion 280. Along with the application of the erase voltage Vers, the P well voltage Vpw reaches about 20 V at timing T2-T3. During the period, the memory cell of the selected block is erased. At timing T3, the application of the erase voltage Vers is over. At timing T3-T4, the discharging enabling signal DEN is migrated to the H level, and the discharging transistors Q2, Q3, Q4 and Q5 are conducted. Accordingly, a discharging path is generated between each gate of the transistors BIASe, BIASo, BLSe, BLSo and the reference potential. Furthermore, a discharging path is generated between the P well 230, the source line SL, the imaginary power VPRE and the reference potential. Each gate of the transistors BIASe, BIASo, BLSe, BLSo, P well, source line SL, imaginary power VPRE are discharged through each discharging path.

Figure 9:
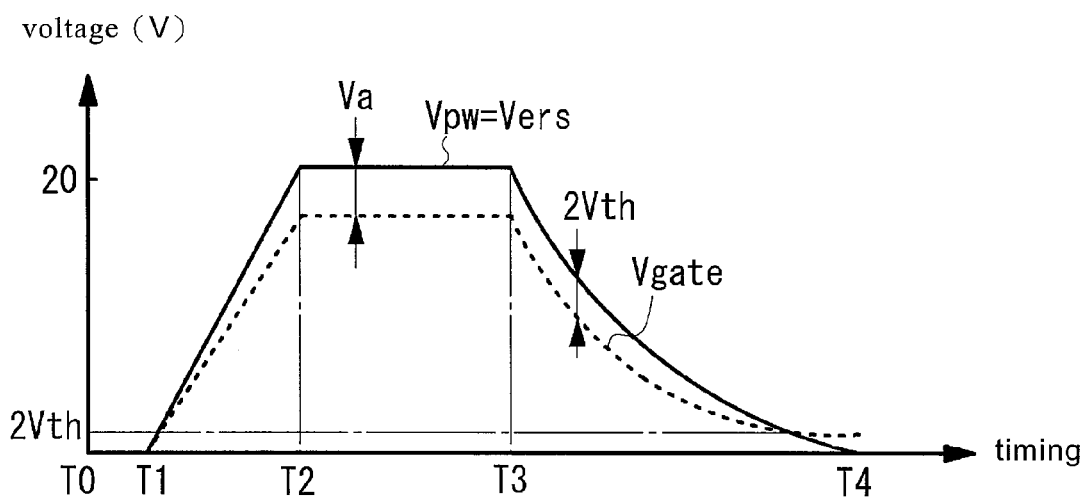
FIG. 9 is a diagram illustrating a relation between a gate voltage of a transistor that forms a bit line selecting circuit and a P well voltage.

FIG. 9 is a diagram illustrating a relation between the P well voltage Vpw and the gate voltage Vgate of the transistors BIASe, BIASo, BLSe and BLSo. As described in FIG. 8, at timing T3, the application of the erase voltage Vers is over. In the meantime, the discharging enabling signal DEN becomes valid. The charge of each gate of the P well, the source line SL, the imaginary power VPRE and the transistors BIASe, BIASo, BLSe and BLSo are discharged to the reference potential through the discharging path.

The gate voltage Vgate of the transistors BIASe, BIASo, BLSe and BLSo reduces because of being coupled to the capacitor of the P well 230. Apart from that, discharging is promoted due to the generation of discharging path of the wiring L2, the diodes D1 and D2 and the discharging transistor Q2. The gate voltage Vgate changes along with the P well voltage Vpw in the manner that the potential difference between the gate voltage Vgate and the P well 230 is no more than about 2Vth. That is, the discharge slope of the gate voltage Vgate is substantially close to that of the P well voltage Vpw and changes along with the P well voltage Vpw by 2Vth difference. Therefore, during the discharging period, the voltage applied to the transistors BIASe, BIASo, BLSe and BLSo is controlled in the manner that it becomes smaller than the breakdown voltage of TDDB.

In addition, at timing T4, the nodes of the P well voltage Vpw, the source line SL, the imaginary power VPRE are discharged until substantially 0 V. On the other hand, the gate voltages Vgate of the transistors BIASe, BIASo, BLSe and BLSo are discharged via the diodes D1 and D2 until substantially 2Vth. Here, if the common node BLn of the even bit line selecting transistor BLSe and the odd bit line selecting transistor BLSo discharges slowly, causing the voltage thereof to maintain at a high state, the even bit line selecting transistor BLSe and the odd bit line selecting transistor BLSo with low voltage may have a breakdown. On the other hand, if the P well voltage Vpw is 0 V, and the voltage of the bit line BL also is 0 V too. Under the circumstances where the gate voltage Vgate is 2Vth, the even bit line selecting transistor BLSe and the odd bit line selecting transistor BLSo are conducted; therefore, the common node BLn is electrically connected to GND. In that case, the voltage of the common node BLn is discharged to about 0 V.

Therefore, according to the embodiment, when the erase action is performed, each gate of the transistors BIASe, BIASo, BLSe and BLSo of the bit line selecting circuit 30A is boosted by being coupled to the capacitor of the P well 230. Thereafter, when the P well voltage is discharged, each of the gates is discharged through the discharging path by changing along with the P well voltage, whereby the breakdown of transistors BIASe, BIASo, BLSe and BLSo due to TDDB may be inhibited.

In addition, the embodiment exemplifies that the memory cell memorizes one bit of data; however, the memory cell may memorize multiple bits of data. Furthermore, the embodiment exemplifies that the NAND string is formed on the substrate surface. However, the NAND string may be formed on the substrate surface in a three dimensional manner.

According to the disclosure, a discharging path is generated between the gate of the at least one bit line selecting transistor and the reference potential. Thus, the voltage of the gate of the bit line selecting transistor changes along with the erase voltage of the P well. Accordingly, the bit line selecting transistor may not be broken down even if it is set to be a low voltage structure.

It will be apparent to those skilled in the art that various modifications and variations can be made to the structure of the disclosed embodiments without departing from the scope or spirit of the disclosure. In view of the foregoing, it is intended that the disclosure cover modifications and variations of this specification provided they fall within the scope of the following claims and their equivalents.

What is claimed is:

1. A semiconductor memory device, comprising:
  a memory cell array formed to have a plurality of NAND strings, the NAND strings are formed by an electrically rewritable memory cell connected in series;
  an erasing member erasing a memory cell in a selected block of the memory cell array; and
  a bit line selecting circuit selecting a bit line connected to the NAND strings respectively,
  at least a bit line selecting transistor which constitutes the bit line selecting circuit formed in a well, the well forming the memory cell,
  wherein the erasing member comprising:
  a first member applying an erase voltage to a well of the selected block;
  a second member setting the at least one bit line selecting transistor formed in the well of the selected block to be in a floating state; and
  a third member comprising a first discharging transistor which is configured to generate a discharging path between a gate of the at least one bit line selecting transistor and a reference potential, when a voltage of the well of the selected block is discharged, the first discharging transistor is conducted and the gate of the at least one bit line selecting transistor is discharged to a reference potential.

2. The semiconductor memory device according to claim 1, wherein:
  the third member comprises at least a diode, the at least one diode is connected to the first discharging transistor in series between the gate of the at least one bit line selecting transistor and the reference potential.

3. The semiconductor memory device according to claim 2, wherein:
  the at least one diode generates a fixed potential difference between the gate of the at least one bit line selecting transistor and the well during a discharging period, the fixed potential difference is less than time dependent dielectric breakdown of the at least one bit line selecting transistor.

4. The semiconductor memory device according to claim 1, wherein:

the third member comprises a second discharging transistor and a third discharging transistor, the second discharging transistor is configured to generate a discharging path between the well and the reference potential, the third discharging transistor is configured to generate a discharging path between the reference potential and a source line that is co-connected to the NAND strings of the well, and the third discharging transistor supplies a common discharge enabling signal to each gate of the first discharging transistor, the second discharging transistor and the third discharging transistor.

5. The semiconductor memory device according to claim 4, wherein:

when a voltage of the well and a voltage of the source line are discharged to the reference potential via the second discharging transistor and the third discharging transistor, the at least one diode has a threshold larger than a threshold of the at least one bit line selecting transistor.

6. The semiconductor memory device according to claim 4, wherein:

the at least one bit line selecting transistor comprises an even bit line selecting transistor for selecting an even bit line and an odd bit line selecting transistor for selecting an odd bit line, the even bit line selecting transistor and the odd bit line selecting transistor being conducted in a manner that a voltage of a common node of the even and odd bit line selecting transistors is discharged to the reference potential.

7. The semiconductor memory device according to claim 6, wherein:

the at least one diode comprises a transistor that bears higher voltage than the at least one bit line selecting transistor.

8. The semiconductor memory device according to claim 7, wherein:

the bit line selecting circuit comprises an even bias voltage transistor applying a bias voltage to the even bit line and an odd bias voltage transistor applying a bias voltage to the odd bit line, the third member discharges each gate of the even bias voltage transistor and the odd bias voltage transistor.

* * * * *